(12) United States Patent
Ishizaka (10) Patent No.: US 7,358,619 B2
(45) Date of Patent: Apr. 15, 2008

(54) TAPE CARRIER FOR TAB

(75) Inventor: Hitoshi Ishizaka, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/467,437

(22) Filed: Aug. 25, 2006

(65) Prior Publication Data

US 2007/0045790 A1 Mar. 1, 2007

(30) Foreign Application Priority Data

Sep. 1, 2005 (JP) ............................. 2005-253447

(51) Int. Cl.
- *H01L 23/544* (2006.01)
- *H01L 23/58* (2006.01)
- *H01L 23/48* (2006.01)
- *H01L 23/52* (2006.01)
- *H01L 29/40* (2006.01)

(52) U.S. Cl. ................. 257/797; 257/737; 257/738; 257/780; 257/781; 257/782; 257/783; 257/798

(58) Field of Classification Search ........ 257/737–738, 257/780–783, 797, 798
See application file for complete search history.

(56) References Cited

U.S. PATENT DOCUMENTS

| | | | |
|---|---|---|---|
| 5,036,380 A * | 7/1991 | Chase | 257/668 |
| 5,897,337 A * | 4/1999 | Kata et al. | 438/114 |
| 6,011,315 A * | 1/2000 | Toyosawa et al. | 257/783 |
| 6,342,727 B1 * | 1/2002 | Fujimori | 257/668 |
| 6,380,620 B1 * | 4/2002 | Suminoe et al. | 257/706 |
| 6,410,860 B2 * | 6/2002 | Tamura | 174/260 |
| 6,441,476 B1 * | 8/2002 | Emoto | 257/686 |
| 6,563,212 B2 * | 5/2003 | Shibamoto et al. | 257/712 |
| 6,818,989 B2 * | 11/2004 | Higuchi et al. | 257/738 |
| 6,891,198 B2 * | 5/2005 | Matsumura et al. | 257/81 |
| 2003/0017652 A1 * | 1/2003 | Sakaki et al. | 438/123 |
| 2004/0085743 A1 * | 5/2004 | Juang | 361/813 |
| 2005/0121796 A1 * | 6/2005 | Park et al. | 257/773 |
| 2005/0167808 A1 * | 8/2005 | Sasaki et al. | 257/678 |
| 2005/0205524 A1 * | 9/2005 | Lee et al. | 216/91 |
| 2005/0230790 A1 | 10/2005 | Naito et al. | |
| 2005/0260391 A1 * | 11/2005 | Nakamura et al. | 428/209 |

FOREIGN PATENT DOCUMENTS

| | | |
|---|---|---|
| JP | 06-112603 A | 4/1994 |
| JP | 08-186341 A | 7/1996 |
| JP | 2001-223457 A | 8/2001 |
| JP | 2002-217503 A | 8/2002 |
| JP | 2003-051650 A | 2/2003 |
| JP | 2003-068805 A | 3/2003 |
| JP | 2004-134442 A | 4/2004 |

\* cited by examiner

*Primary Examiner*—Ida M. Soward
(74) *Attorney, Agent, or Firm*—Panitch Schwarze Belisario & Nadel LLP (57) ABSTRACT

A striped tape carrier for TAB includes a plurality of mounting parts. In the respective mounting parts, wiring patterns to bond electrodes of electronic components are formed. Each of exposure regions includes a predetermined number of mounting parts. On both sides of each of the exposure regions, alignment marks and identification marks are formed. The alignment marks are used for alignment during the exposure. The identification marks are used for specifying positions of the respective exposure regions on the tape carrier.

6 Claims, 9 Drawing Sheets

TAPE CARRIER FOR TAB

BACKGROUND OF THE INVENTION

1. Field of the Invention

The present invention relates to a tape carrier for TAB and a method of manufacturing the same.

2. Description of the Background Art

As a method of manufacturing a printed circuit board, a TAB (Tape Automated Bonding) technique is known. In this TAB technique, predetermined conductive wiring patterns are formed on a tape carrier (a striped tape board). In addition, electrodes of electronic components are bonded to the wiring patterns formed on the tape carrier. Thus, the electronic components are mounted on the tape carrier.

Figure 11:
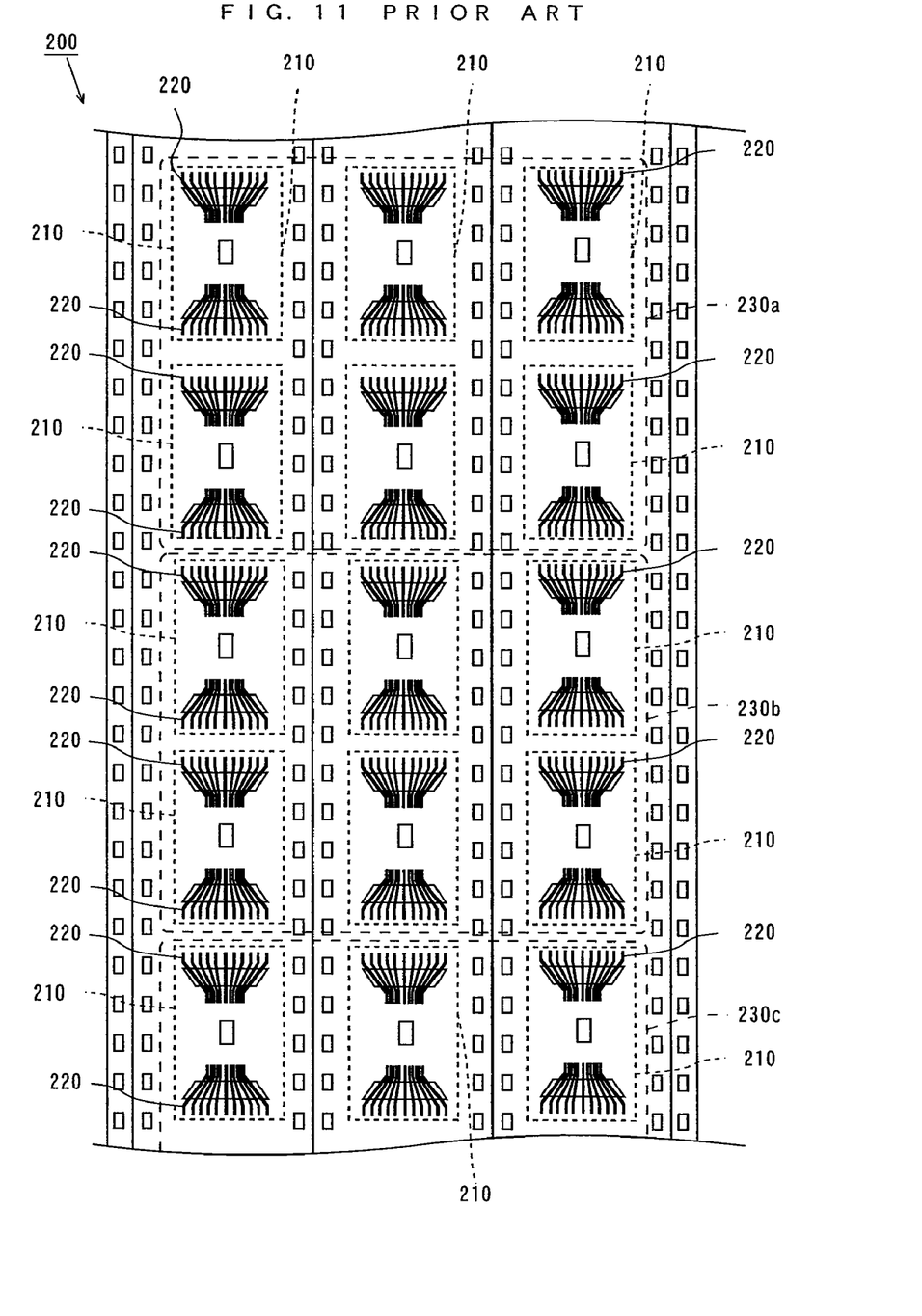
FIG. 11 is a top view showing one example of a conventional tape carrier for TAB.

FIG. 11 is a top view showing one example of a conventional tape carrier for TAB. As shown in FIG. 11, on a striped tape carrier 200, a plurality of mounting parts 210 in which electronic components are to be mounted are formed in a matrix pattern. Wiring patterns 220 are formed in the mounting parts 210. The wiring patterns 220 are formed by exposing and developing a photoresist in a predetermined pattern.

Meanwhile, there are cases where defects of the wiring patterns 220 occur due to inappropriate processing conditions or inclusion of foreign matters during the exposure processing or the development processing. Although such defects of the wiring patterns 220 are detected in an inspection process, it is necessary to specify where the defects of the wiring patterns 220 occur on the tape carrier 200 for process control.

Here, generally, in an exposure device, the exposure of the plurality of wiring patterns 220 is performed simultaneously (for example, refer to JP 2003-68805 A). For example, in the example of FIG. 11, the exposure of the mounting parts 210 at six locations included in a region (hereinafter, referred to as an exposure region) 230a indicated by the broken line is performed simultaneously. Next, the exposure of the mounting parts 210 at six locations in a region 230b adjacent to the region 230a is performed simultaneously, after that, the exposure of the mounting parts 210 at six locations (only three locations are shown in FIG. 11) in a region 230c is performed simultaneously. In this way, in the exposure device, the exposure is performed in each of the predetermined exposure regions in order.

Positions of the respective exposure regions on the tape carrier 200 can be specified, for example, by measuring a distance in a longitudinal direction of the tape carrier 200 using a roll counter. This makes it possible to specify where the defects of the wiring patterns 220 occur.

However, when the tape carrier 200 is cut for any reasons in a manufacturing process, it is difficult to specify the positions of the exposure regions in the above-described method. Therefore, it is impossible to specify where the defects of the wiring patterns 220 occur.

SUMMARY OF THE INVENTION

It is an object of the invention to provide a tape carrier for TAB in which the position of a possible defect of a wiring pattern can be easily specified and a method of manufacturing the same.

(1) A tape carrier for TAB according to one aspect of the present invention includes a striped insulating layer having a first surface, a second surface and a plurality of regions arranged in a longitudinal direction, a plurality of wiring patterns formed respectively in the plurality of regions on the first surface of the insulating layer, and a striped substrate arranged on the second surface of the insulating layer such that the plurality of regions on the second surface of the insulating layer are exposed respectively, wherein the striped substrate has a plurality of different identification marks for use in identifying the plurality of regions respectively, and the identification marks are formed corresponding to the respective regions.

In the tape carrier for TAB, the wiring patterns are formed in the plurality of regions of the insulating layer on the striped substrate. In addition, the identification marks are formed corresponding to the respective regions on the striped substrate to identify the plurality of regions respectively.

In this case, since the plurality of regions can be identified respectively by the identification marks, it is possible to easily specify where the respective regions are positioned on the tape carrier for TAB. Accordingly, when a defect of a wiring pattern occurs, the identification mark corresponding to the region where the wiring pattern having the defect is formed makes it possible to easily specify where the defect of the wiring pattern occurs on the tape carrier for TAB.

Furthermore, since the identification marks are formed corresponding to the respective regions, it is possible to easily and reliably specify where the respective regions are positioned on the tape carrier for TAB by reading the identification marks even if the tape carrier for TAB is cut. This makes it possible to easily and reliably specify where the defect of the wiring pattern occurs.

(2) Each of the identification marks may represent a natural number. In this case, since the identification marks that represent the natural numbers are formed corresponding to the respective regions, it is possible to more easily specify where the respective regions are positioned on the tape carrier for TAB.

(3) Each of the identification marks may be comprised of one or a plurality of through-holes, and may represent the natural number by binary number depending on presence or absence of the one or a plurality of through-holes. In this case, it is possible to easily form the identification marks.

(4) Each of the identification marks may have a reference mark for use in recognizing the position of the identification mark. In this case, since the identification marks can be reliably recognized, it is possible to more easily specify the positions of the respective regions on the tape carrier for TAB.

(5) The wiring patterns may be formed by predetermined processing including exposure processing, and the exposure processing may be performed for each region. In this case, since the exposure processing is performed for each region, when a defect occurs during the exposure, it is possible to easily specify when the exposure processing is performed.

(6) The striped substrate may further have alignment marks used for alignment in the exposure processing corresponding to the respective regions, and each identification mark and each alignment mark corresponding to each region may be formed adjacent to each other.

In this case, since each identification mark and each alignment mark are positioned adjacent to each other, the identification marks and the alignment marks may be formed simultaneously by a same mold. This makes it possible to simplify a manufacturing process and reduce a manufacturing cost.

(7) A method of manufacturing a tape carrier for TAB according to another aspect of the present invention includes the steps of forming an insulating layer on a striped substrate having a plurality of regions arranged in a longitudinal direction, forming a plurality of different identification marks for use in identifying the plurality of regions respectively on the striped substrate, and forming wiring patterns in the plurality of regions on the striped substrate with the insulating layer interposed therebetween, wherein the identification marks are formed corresponding to the respective regions.

In the method of manufacturing the tape carrier for TAB, the identification marks for use in identifying the plurality of regions respectively on the striped substrate are formed, and the wiring patterns are formed in the plurality of regions.

In the tape carrier for TAB manufactured by this manufacturing method, since it is possible to identify the plurality of regions respectively by the identification marks, it is possible to easily specify the positions of the respective regions on the tape carrier for TAB. Accordingly, when a defect of a wiring pattern occurs, the identification mark corresponding to the region where the wiring pattern having the defect is formed makes it possible to easily specify where the defect of the wiring pattern occurs on the tape carrier for TAB.

Furthermore, since the identification marks are formed corresponding to the respective regions, even if the tape carrier for TAB is cut, it is possible to easily and reliably specify the positions of the respective regions on the tape carrier for TAB by reading the identification marks. This makes it possible to easily and reliably specify where the defect of the wiring pattern occurs.

(8) A method of manufacturing a tape carrier for TAB according to still another aspect of the present invention includes the steps of forming an insulating layer on a striped substrate having a plurality of regions arranged in a longitudinal direction, forming a metal thin film on the insulating layer, forming a plurality of different identification marks for use in identifying the plurality of regions respectively along at least one side in a longitudinal direction of the striped substrate, forming a resist film on the metal thin film, exposing the resist film for each region, forming a plating resist in a predetermined pattern by developing the exposed resist film, forming a conductor layer on the metal thin film excluding the portion of the plating resist by electrolytic plating, and forming wiring patterns composed of the metal thin film and the conductor layer in the respective regions by removing the plating resist and the portion of the metal thin film under the plating resist, wherein the identification marks are formed corresponding to the respective regions.

In the method of manufacturing the tape carrier for TAB, the identification marks for use in identifying the plurality of regions respectively are formed on the striped substrate. In addition, the plating resists are formed for each region by exposing and developing the resist film and the wiring patterns are formed using the plating resists.

In the tape carrier for TAB manufactured by this manufacturing method, since the identification marks make it possible to identify the plurality of regions respectively, it is possible to easily specify the positions of the respective regions on the tape carrier for TAB. Accordingly, when a defect of a wiring pattern occurs, the identification mark corresponding to the region where the wiring pattern having the defect is formed makes it possible to easily specify where the defect of the wiring pattern occurs on the tape carrier for TAB.

Furthermore, since the identification marks are formed corresponding to the respective regions, even if the tape carrier for TAB is cut, it is possible to easily and reliably specify the positions of the respective regions on the tape carrier for TAB by reading the identification marks. This makes it possible to easily and reliably specify where the defect of the wiring pattern occurs.

(9) The method of manufacturing the tape carrier for TAB may further include the step of forming alignment marks used for alignment during the exposure along at least one side of the striped substrate corresponding to the respective regions, wherein the identification mark and the alignment mark corresponding to each region may be formed simultaneously.

In this case, since the identification mark and the alignment mark are formed simultaneously, it is possible to simplify the manufacturing process and reduce a manufacturing cost.

Other features, elements, characteristics, and advantages of the present invention will become more apparent from the following description of preferred embodiments of the present invention with reference to the attached drawings.

DESCRIPTION OF THE PREFERRED EMBODIMENTS

Hereinafter, a tape carrier for TAB and a method of manufacturing the same according to an embodiment of the present invention are described.

(1) Basic Configuration of Tape Carrier for TAB

Figure 1:
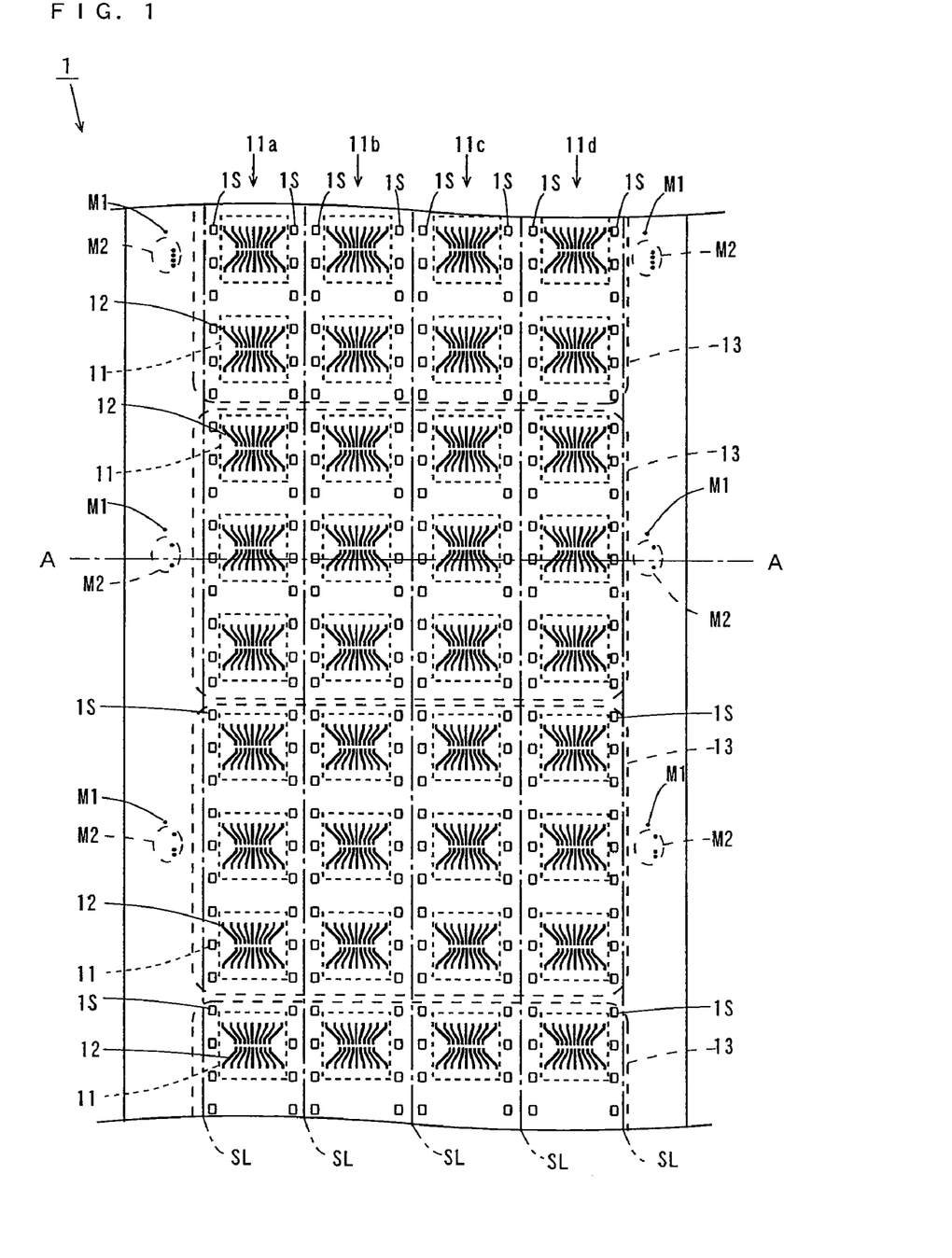
FIG. 1 is a top view of a tape carrier for TAB according to the embodiment of the present invention.

FIG. 1 is a top view of a tape carrier for TAB according to the embodiment of the present invention. As shown in FIG. 1, a striped tape carrier 1 for TAB includes a plurality of mounting parts 11 to mount electronic components such as semiconductor chips or the like. The respective mounting parts 11 are provided with predetermined spaces interposed therebetween in a width direction of the tape carrier 1 and in a longitudinal direction thereof, and form four lines 11a to 11d so as to extend in the longitudinal direction.

On both sides of the respective lines 11a to 11d, a plurality of square-shaped sprocket holes 1S are formed with predetermined spaces interposed therebetween so as to extend in the longitudinal direction of the tape carrier 1. In the respective mounting parts 11, wiring patterns 12 are formed to bond electrodes of the electronic components or the like.

The wiring patterns 12 are formed by exposing and developing a resist film and applying predetermined processing thereto (details are described below). In this embodiment, the exposure of the resist film is performed for each predetermined region. In the example of FIG. 1, the exposure of the resist film is performed for each region 13 indicated by the broken lines (hereinafter, referred to as exposure regions).

On both sides of the respective exposure regions 13 on the tape carrier 1, alignment marks M1 and identification marks M2 are formed. The alignment marks M1 are used for alignment during the exposure. The identification marks M2 are used to specify the positions of the respective exposure regions 13 on the tape carrier 1. Details of the identification marks M2 are described below.

In this embodiment of the present invention, the tape carrier 1 for TAB is used being divided into four tape carriers along slit lines SL indicated by the one-dot and dash lines in FIG. 1. After the electronic components are bonded to the respective mounting parts 11 of the divided tape carriers, electronic devices are completed by cutting the tape carrier for each mounting part 11.

(2) Configuration of Mounting Part

Hereinafter, the mounting part 11 is described more in detail.

Figure 2:
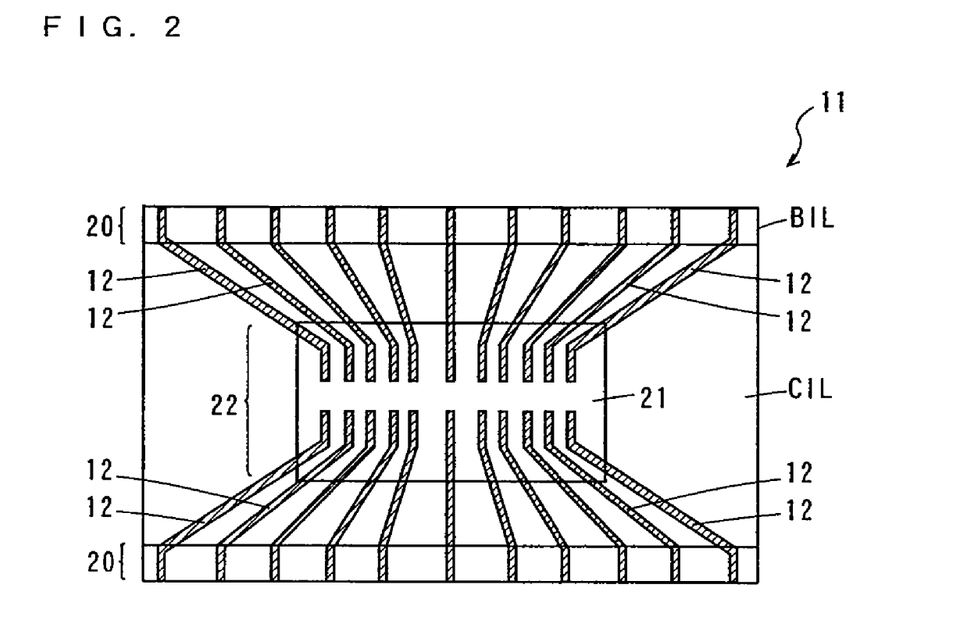
FIG. 2 is a plan view showing a mounting part.

FIG. 2 is a plan view showing the mounting part 11. As shown in FIG. 2, a plurality of wiring patterns 12 are formed on a base insulating layer BIL. The plurality of wiring patterns 12 include ones formed so as to lie from the center of the base insulating layer BIL toward one side thereof and the others formed so as to lie from the center of the base insulating layer BIL toward another side thereof.

A cover insulating layer CIL is provided so as to cover a region excluding one side region of the base insulating layer BIL and another side region thereof. Regions in which this cover insulating layer CIL does not cover ends of the respective wiring patterns 12 are referred to as outer lead portions 20.

Furthermore, an electronic component (not shown) such as a semiconductor chip or the like is mounted to the ends of the respective wiring patterns 12 at the center of the base insulating layer BIL. A region in which this electronic component is mounted is shown as a mounting region 21. A region where the respective wiring patterns 12 are arranged in this mounting region 21 is referred to as an inner lead portion 22. The inner lead portion 22 is not covered by the cover insulating layer CIL.

(3) Method of Manufacturing Tape Carrier for TAB

Hereinafter, the methods for manufacturing the tape carrier 1 for TAB are described in the case of using a semiadditive method and in the case of using a subtractive method.

(a) Case of using semiadditive method

Figure 3:
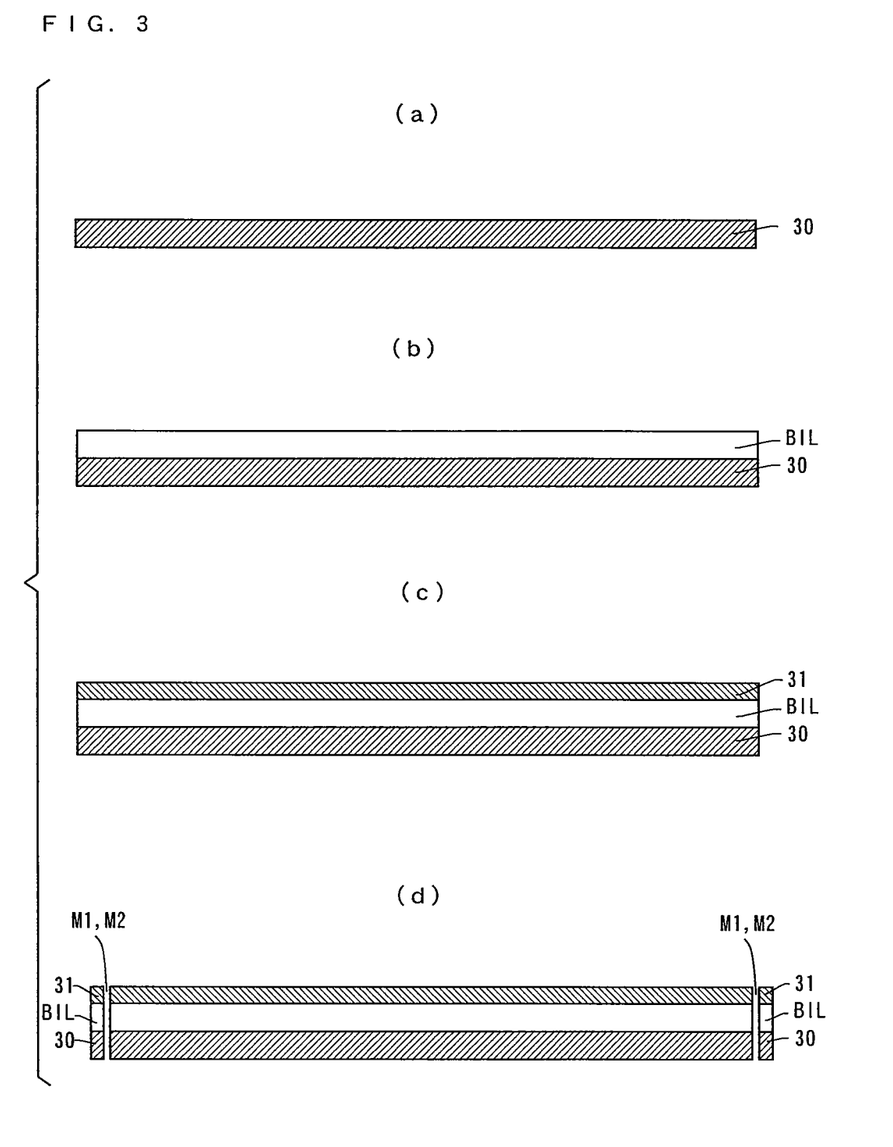
FIG. 3 is a diagram explaining steps of manufacturing the tape carrier for TAB in the case of using a semiadditive method.
Figure 4:
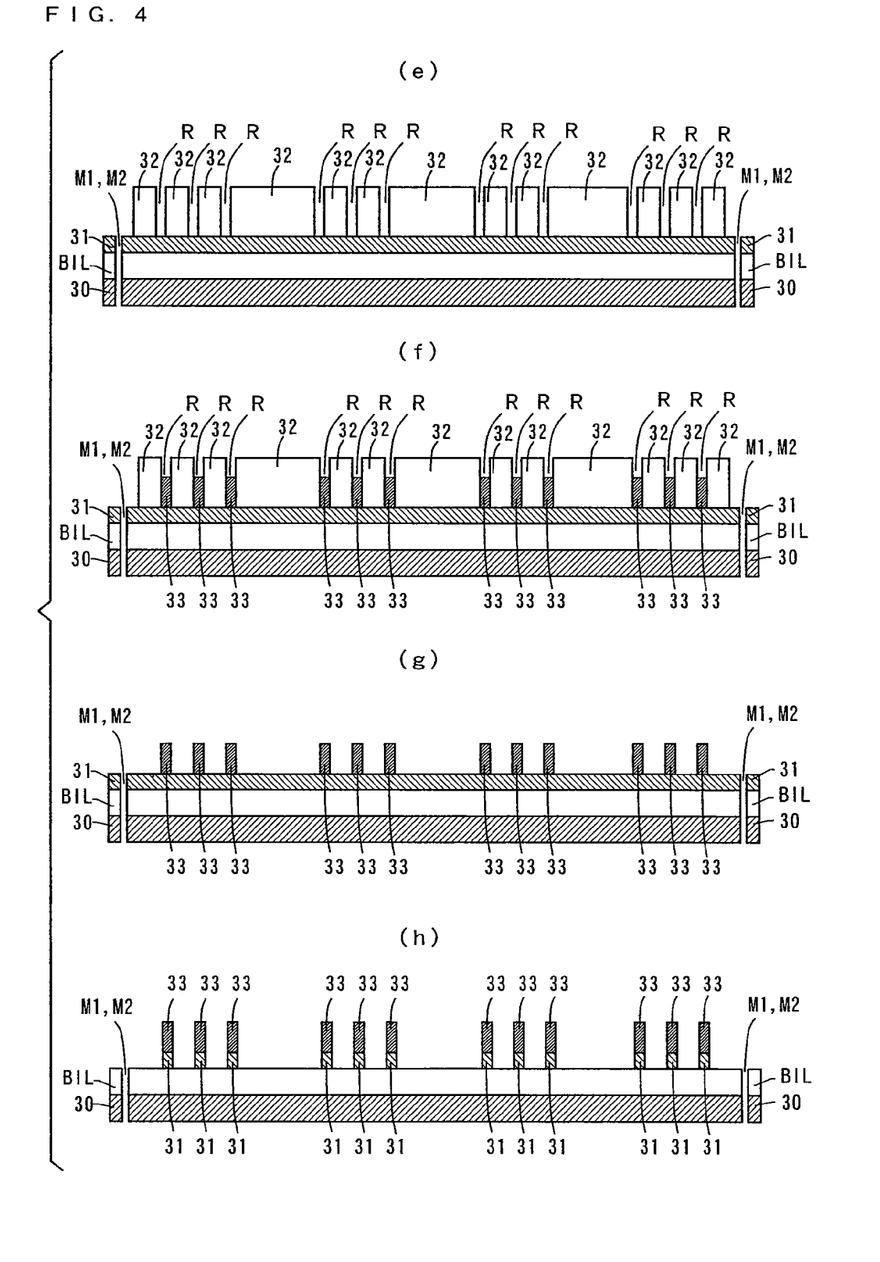
FIG. 4 is a diagram explaining the steps of manufacturing the tape carrier for TAB in the case of using the semiadditive method.
Figure 5:
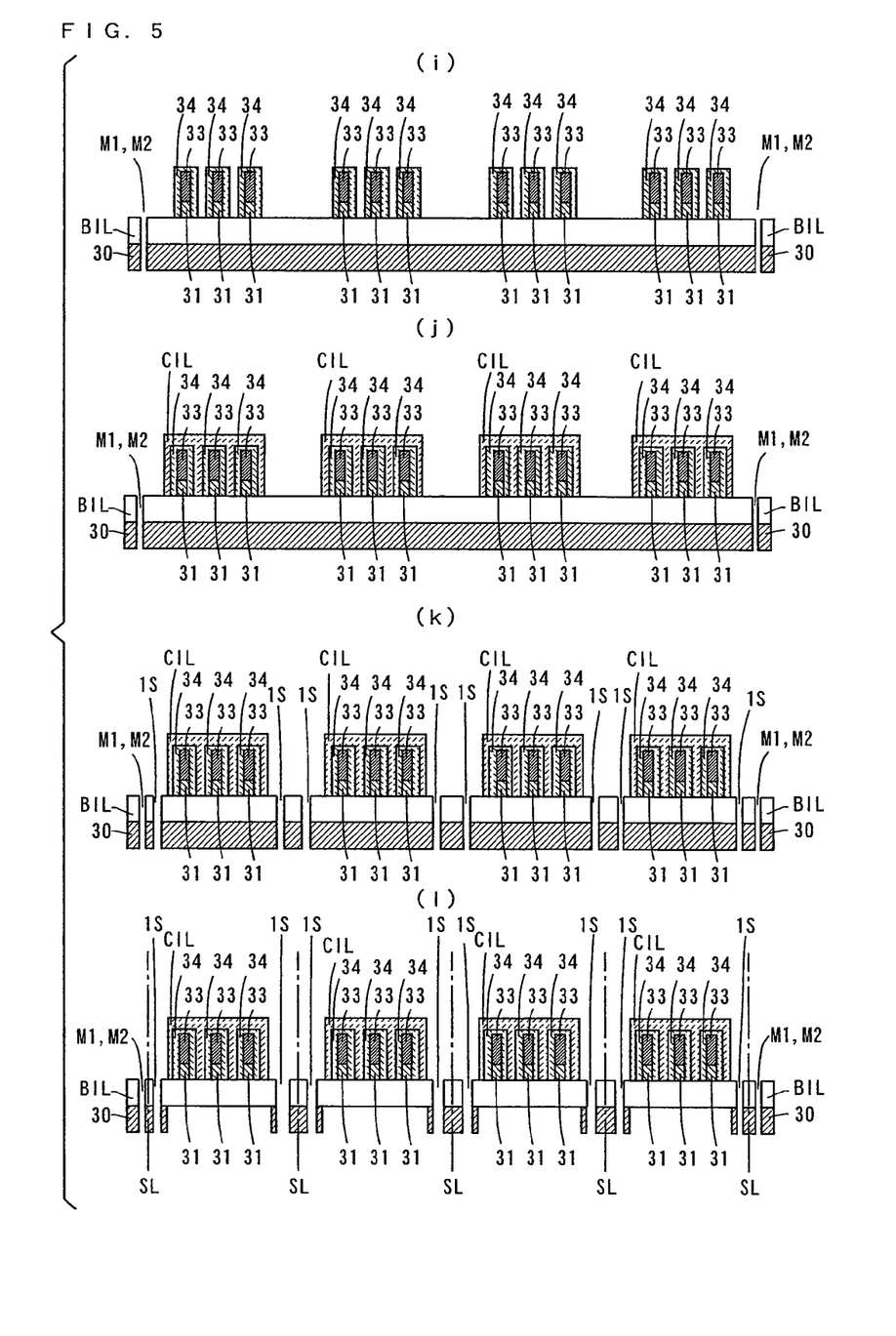
FIG. 5 is a diagram explaining the steps of manufacturing the tape carrier for TAB in the case of using the semiadditive method.

FIGS. 3 to 5 are diagrams explaining steps of manufacturing the tape carrier 1 for TAB in the case of using the semiadditive method. In FIGS. 3 to 5, a film formation process on a cross-sectional surface of A-A line in FIG. 1 is shown.

First, as shown in FIG. 3(a), a striped substrate 30 is prepared. As the striped substrate 30, for example, a metal such as a stainless plate, a copper plate, a nickel plate or the like can be used.

Next, as shown in FIG. 3(b), the base insulating layer BIL is formed on the striped substrate 30. The base insulating layer BIL is composed of, for example, a resin such as polyimide, polyester or the like.

As shown in FIG. 3(c), a metal thin film 31 is formed on the base insulating layer BIL by sputtering. As the metal thin film 31, although any material having a conductivity may be used, it is preferable to use copper.

As shown in FIG. 3(d), in the vicinity of both sides of the striped substrate 30, the alignment marks M1 and the identification marks M2 are formed so as to pass through the striped substrate 30, the base insulating layer BIL and the metal thin film 31. The alignment marks M1 and the identification marks M2 are formed, for example, by punching with a mold. In addition, the alignment marks M1 and the identification marks M2 are formed corresponding to respective exposure regions 13 as explained in FIG. 1.

As shown in FIG. 4(e), plating resists 32 having grooves R in predetermined patterns are formed on the metal thin film 31. The plating resists 32 are formed, for example, by forming a resist film on the metal thin film 31 with a dry film resist or the like, exposing the resist film for each of the exposure regions 13 (see FIG. 1) in a predetermined pattern using the above-described alignment marks M1 and then developing the resist film.

As shown in FIG. 4(f), conductor layers 33 are formed in the grooves R on the metal thin film 31 by electrolytic plating. As the conductor layer 33, for example, copper can be used.

As shown in FIG. 4(g), the plating resists 32 are removed by chemical etching (wet etching) or stripping. Next, as shown in FIG. 4(h), the exposed regions of the metal thin film 31 are removed by etching. Thus, the wiring patterns 12 (see FIGS. 1 and 2) each composed of the metal thin films 31 and the conductor layers 33 are formed.

As shown in FIG. 5(i), electroless tin plating layers 34 are formed so as to cover the wiring patterns 12. After that, as shown in FIG. 5(j), the cover insulating layers CIL are formed in the predetermined regions of the mounting parts 11 (see FIGS. 1 and 2) so as to cover the wiring patterns 12 and the electroless tin plating layers 34.

As shown in FIG. 5(k), the sprocket holes 1S are formed on both sides of the mounting parts 11 (see FIGS. 1 and 2). Next, as shown in FIG. 5(l), regions of the striped substrate 30 in lower regions of the mounting parts 11 are removed by etching. Thus, the tape carrier 1 for TAB shown in FIGS. 1 and 2 is completed.

Finally, the tape carrier 1 for TAB is divided into four tape carriers along the slit lines SL (see FIG. 1) shown in FIG. 5(l).

(b) Case of using subtractive method

Next, a method of manufacturing the tape carrier 1 for TAB in the case of using the subtractive method is described.

First, similarly to FIGS. 3 (a) to (c), the base insulating layer BIL and the metal thin film 31 are formed on the striped substrate 30.

Figure 6:
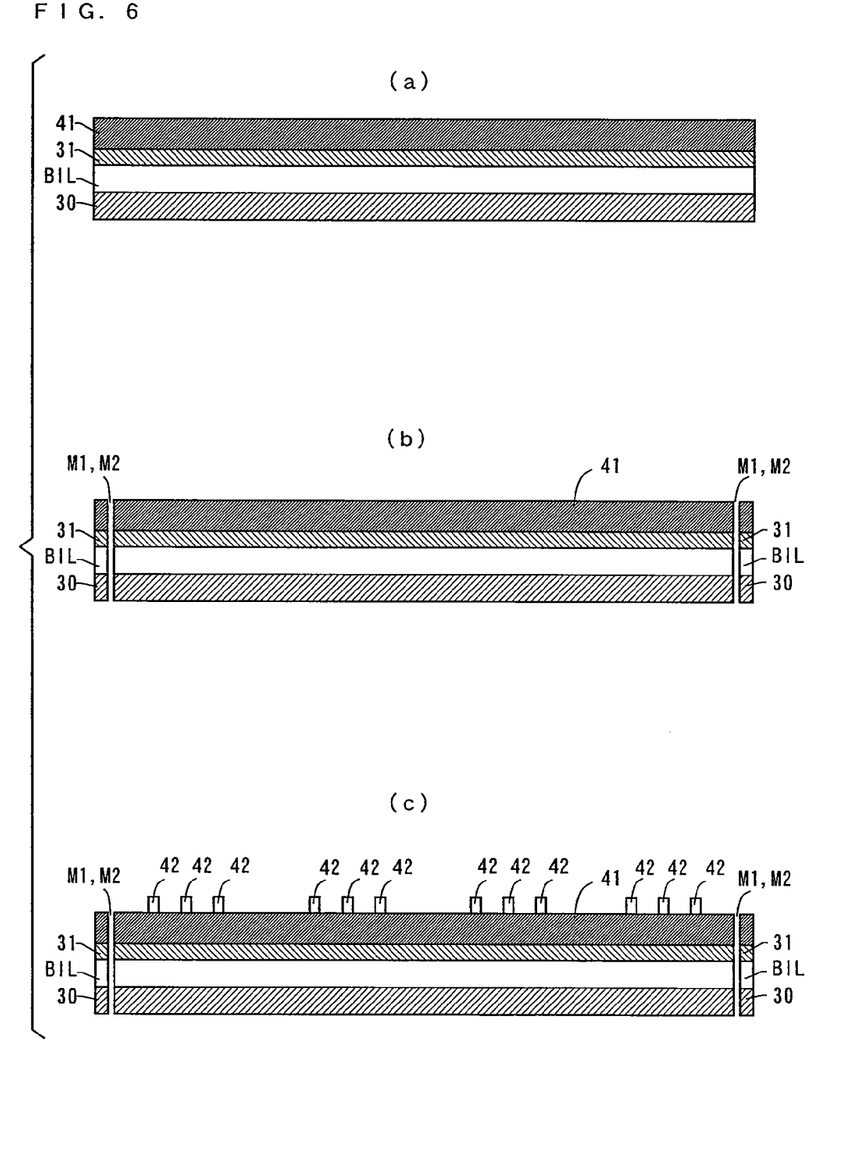
FIG. 6 is a diagram explaining steps of manufacturing the tape carrier for TAB in the case of using a subtractive method.

Next, as shown in FIG. 6(a), a conductor layer 41 is formed on a metal thin film 31. As the conductor layer 41, for example, copper can be used. Then, as shown in FIG. 6(b), in the vicinity of both sides of the striped substrate 30, the alignment marks M1 and the identification marks M2 are formed so as to pass through the striped substrate 30, the base insulating layer BIL, the metal thin film 31 and the conductor layer 41. The alignment marks M1 and the identification marks M2 are formed, for example, by punching with a mold. In addition, as explained in FIG. 1, the alignment marks M1 and the identification marks M2 are formed corresponding to respective exposure regions 13.

As shown in FIG. 6(c), etching resists 42 having predetermined patterns are formed on the conductor layer 41. The etching resists 42 are formed, for example, by forming a resist film on the conductor layer 41 with dry film resist or the like, exposing the resist film for each of the exposure regions 13 (see FIG. 1) in a predetermined pattern using the above-described alignment marks M1 and then developing the resist film.

Figure 7:
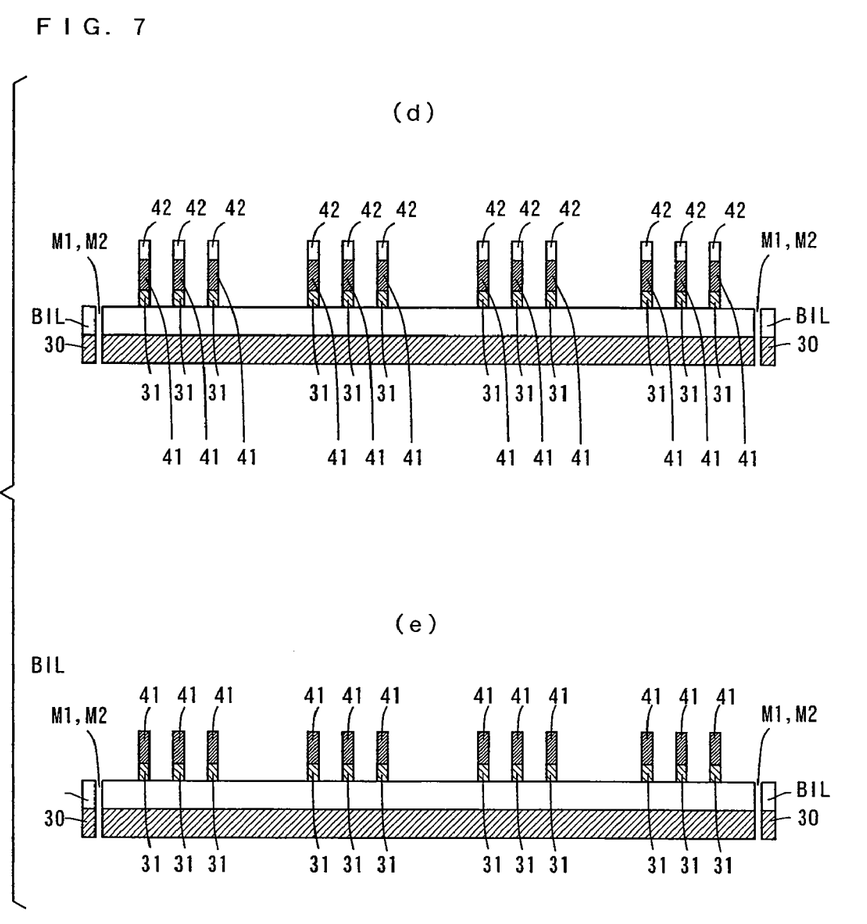
FIG. 7 is a diagram explaining the steps of manufacturing the tape carrier for TAB in the case of using the subtractive method.

As shown in FIG. 7(*d*), regions of the metal thin film 31 and the conductor layer 41 excluding lower regions of the etching resists 42 are removed by etching. Next, as shown in FIG. 7(*e*), the etching resists 42 are removed by a stripping liquid. Thus, the wiring patterns 12 (see FIGS. 1 and 2) each composed of the metal thin films 31 and the conductor layers 41 are formed.

After that, the tape carrier 1 for TAB is completed via the steps explained in FIGS. 5(*i*) to (*l*).

(4) Identification Marks

Next, details of the identification marks M2 are described.

Figure 8:
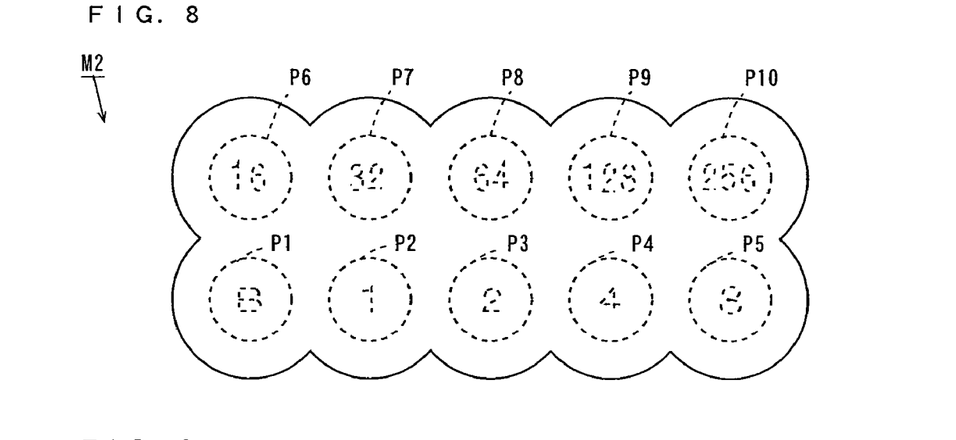
FIG. 8 is a top view showing identification marks.

FIG. 8 is a top view showing the identification mark M2 in FIG. 1. As shown in FIG. 8, the identification mark M2 includes punching portions P1 to P10. The identification mark M2 is composed of a plurality of through-holes formed by punching any of the punching portions P1 to P10. The punching portions P1 to P10 can be punched together with the alignment mark M1 by the same mold at the same time.

In this embodiment, the identification mark M2 can represent natural numbers by combinations of the punched portions P2 to P10. Hereinafter, roles given to the respective punching portions P1 to P10 and a method of representing the natural numbers by the punching portions P2 to P10 are explained.

The punching portion P1 is regarded as a reference hole for an optical sensor to recognize the position of the identification mark M2. In this embodiment, the optical sensor first recognizes the position of the identification mark M2 by detecting a through-hole formed by punching the punching portion P1. After that, the optical sensor detects the through-holes of the punching portions P2 to P10 and reads the position of the exposure region 13 by an after-mentioned method. Accordingly, the punching portion P1 is always punched.

Note that it is possible to confirm which punching portions are punched with a visual check instead of the optical sensor.

The punching portions P2 to P10 correspond to 1, 2, 4, 8, 16, 32, 64, 128 and 256, respectively. Accordingly, the natural numbers of 1 to 511 can be represented by combinations of the punched portions P2 to P10.

Figure 9:
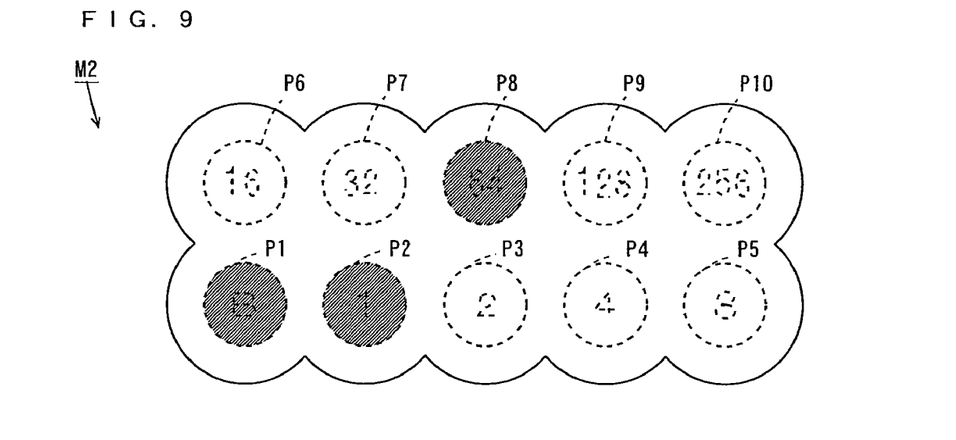
FIG. 9 is a top view showing the identification marks.
Figure 10:
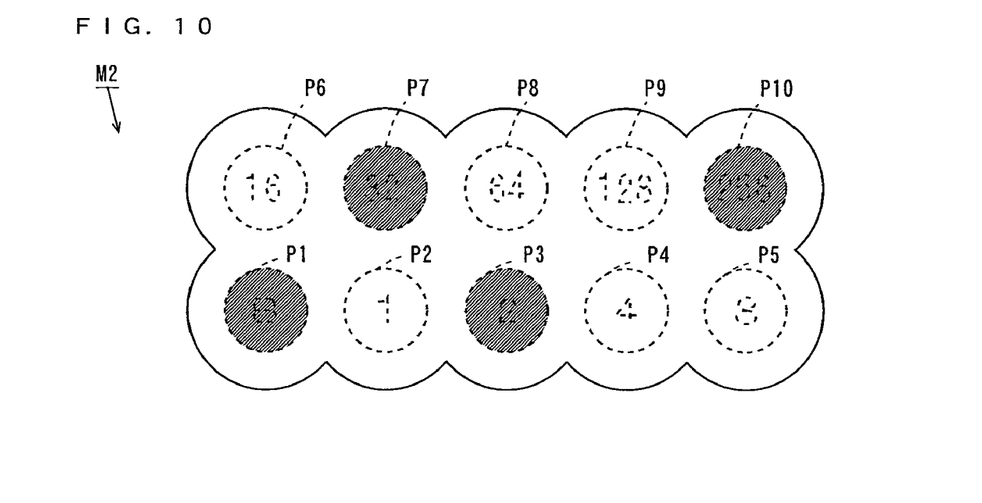
FIG. 10 is a top view showing the identification marks.

For example, as shown in FIG. 9, when the punching portions P1, P2, P8 are punched, the identification mark M2 indicates that 1 (P2) +64 (P8), which represents 65. In addition, as shown in FIG. 10, when the punching portions P1, P3, P7, P10 are punched, the identification mark M2 indicates that 2 (P3) +32 (P7) +256 (P10), which represents 290. That is to say, in this embodiment, the natural numbers of 1 to 511 are represented by binary numbers depending on presence or absence of the through-holes.

In this embodiment of the present invention, the natural numbers represented by these identification marks M2 indicate the positions of the exposure regions 13 on the tape carrier 1. More specifically, the identification marks M2 representing 1 (the punching portions P1, P2 are punched) are formed on both sides of the exposure region 13 on the tape carrier 1 where the exposure is to be performed first, the identification marks M2 representing 64 (FIG. 9) are formed on both sides of the exposure region 13 where the exposure is to be performed sixty-fourth, and the identification marks M2 representing 290 (FIG. 10) are formed on both sides of the exposure region 13 where the exposure is to be performed two hundred ninetieth.

Although the identification marks M2 are formed on both sides of the exposure regions 13 in FIG. 1, the identification marks M2 may be formed on just one side of the exposure regions 13.

Furthermore, although the punching portion P1 that is a reference hole for the optical sensor to recognize the position of the identification mark M2 is provided in the example of FIG. 8, the punching portion P1 may not be provided when the identification mark M2 is detected using a device that does not require a reference hole to recognize the identification mark M2.

In addition, although the case where the natural numbers of 1 to 511 are represented is explained in the example of FIG. 8, the number of the punching portions may be increased when the natural numbers of not less than 512 need to be represented. For example, when the natural numbers of 1 to 1023 are required to be represented, a punching portion P11 (not shown) corresponding to 512 may be further formed.

Furthermore, a diameter of the punching portions is preferably 0.05 to 2 mm, and more preferably 0.1 to 1 mm. If the diameter is smaller than 0.05 mm, it is difficult to punch, and if the diameter is larger than 2 mm, the dimension of the punching portion becomes too large and may limit area for mounting parts 11.

(5) Effects of the Embodiment

As mentioned above, in this embodiment, along the sides of the tape carrier 1 for TAB, the identification marks M2 showing the positions of the exposure regions 13 on the tape carrier 1 are formed. Accordingly, when the defects of the wiring patterns 12 are detected in an inspection process, it is possible to easily specify where the defects of the wiring patterns 12 occur by reading the identification marks M2 formed in the vicinity of the wiring patterns 12.

Furthermore, in this embodiment, since the identification marks M2 are formed corresponding to respective exposure regions 13, even if the tape carrier 1 is cut, it is possible to easily specify where the wiring patterns 12 of which defects occur are positioned on the tape carrier 1 by reading the identification marks M2.

Although each of the exposure regions 13 includes twelve mounting parts 11 in the example of FIG. 1, the number of the mounting parts 11 included in each of the exposure region 13 is not limited to twelve. For example, each of the exposure regions 13 may be comprised of one mounting part 11 and each of the exposure regions 13 may be comprised of twenty mounting parts 11.

Furthermore, although the mounting parts 11 are provided at four locations in the width direction of the tape carrier 1 for TAB in the example of FIG. 1, the number of the mounting parts 11 provided in the width direction is not limited to four. For example, the mounting part 11 may be provided at just one location in the width direction of the tape carrier 1 for TAB and the mounting parts 11 may be provided at three locations.

(6) Correspondence Between Each Constituent Element of the Claims and Each Part of the Embodiment In the embodiment of the present invention, the base insulating layer BIL corresponds to an insulating layer, the exposure region 13 corresponds to a region, and the punching portion 1 corresponds to a reference mark.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A tape carrier for TAB, comprising:
a striped insulating layer having a first surface, a second surface and a plurality of regions arranged in a longitudinal direction;
a plurality of wiring patterns formed respectively in said plurality of regions on said first surface of said insulating layer; and
a striped substrate arranged on said second surface of said insulating layer such that said plurality of regions on said second surface of said insulating layer are exposed respectively, wherein
said striped substrate has a plurality of different identification marks for use in identifying said plurality of regions respectively, and
said identification marks are formed corresponding to said respective regions.

2. The tape carrier for TAB according to claim 1, wherein each of said identification marks represents a natural number.

3. The tape carrier for TAB according to claim 2, wherein each of said identification marks is comprised of one or a plurality of through-holes and represents a natural number by a binary number depending on presence or absence of said one or a plurality of through-holes.

4. The tape carrier for TAB according to claim 1, wherein each of said identification marks has a reference mark for use in recognizing the position of said identification mark.

5. The tape carrier for TAB according to claim 1, wherein
said wiring patterns are formed by predetermined processing including exposure processing, and
said exposure processing is performed for each region.

6. The tape carrier for TAB according to claim 5, wherein
said striped substrate further has alignment marks used for alignment in said exposure processing corresponding to said respective regions, and
each identification mark and each alignment mark corresponding to each region are formed adjacent to each other.

* * * * *